(12) United States Patent
Bradshaw

(10) Patent No.: US 10,643,719 B2
(45) Date of Patent: May 5, 2020

(54) ENHANCED READ DISTURBANCE DETECTION AND REMEDIATION FOR A MEMORY SUB-SYSTEM

(71) Applicant: Micron Technology, Inc., Boise, ID (US)

(72) Inventor: Samuel E. Bradshaw, Sacramento, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 31 days.

(21) Appl. No.: 16/121,451

(22) Filed: Sep. 4, 2018

(65) Prior Publication Data
US 2020/0075109 A1    Mar. 5, 2020

(51) Int. Cl.
| | | |
|---|---|---|
| *G11C 16/04* | (2006.01) | |
| *G11C 16/34* | (2006.01) | |
| *G11C 16/26* | (2006.01) | |
| *G11C 29/52* | (2006.01) | |

(52) U.S. Cl.
CPC ......... *G11C 16/3431* (2013.01); *G11C 16/26* (2013.01); *G11C 16/3404* (2013.01); *G11C 16/3495* (2013.01); *G11C 29/52* (2013.01)

(58) Field of Classification Search
CPC . G11C 16/3431; G11C 16/26; G11C 16/3404; G11C 16/3495

USPC .................................................. 365/185.02
See application file for complete search history.

(56) References Cited

U.S. PATENT DOCUMENTS

| | | | |
|---|---|---|---|
| 2013/0297986 A1* | 11/2013 | Cohen ................ | G06F 11/1048 714/763 |
| 2014/0192436 A1* | 7/2014 | Kwon ................ | G11B 5/5582 360/75 |
| 2015/0378801 A1* | 12/2015 | Navon ................ | G06F 11/076 714/704 |

* cited by examiner

*Primary Examiner* — Vu A Le
(74) *Attorney, Agent, or Firm* — Nicholson De Vos Webster & Elliott LLP

(57) ABSTRACT

A method is described, which includes reading first raw data from a set of memory cells at an indicated address and determining a number of errors in the first raw data. In response to determining that the number of errors is greater than a threshold, the set of memory cells are flagged for rereading. In response to flagging the set of memory cells for rereading, second raw data is read from the set of memory cells and a comparison is performed based on the first raw data and the second raw data to determine a number of non-read disturbance errors. In response to the comparison, the threshold is modified based on the number of non-read disturbance errors.

20 Claims, 8 Drawing Sheets

ENHANCED READ DISTURBANCE DETECTION AND REMEDIATION FOR A MEMORY SUB-SYSTEM

TECHNICAL FIELD

Embodiments of the disclosure relate generally to memory sub-systems, and more specifically, relate to enhanced read disturbance detection and remediation for a memory sub-system.

BACKGROUND ART

A memory sub-system can be a memory module, such as a dual in-line memory module (DIMM), a small outline DIMM (SO-DIMM), or a non-volatile dual in-line memory module (NVDIMM). A memory sub-system can be a storage system, such as a solid-state drive (SSD), or a hard disk drive (HDD). A memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
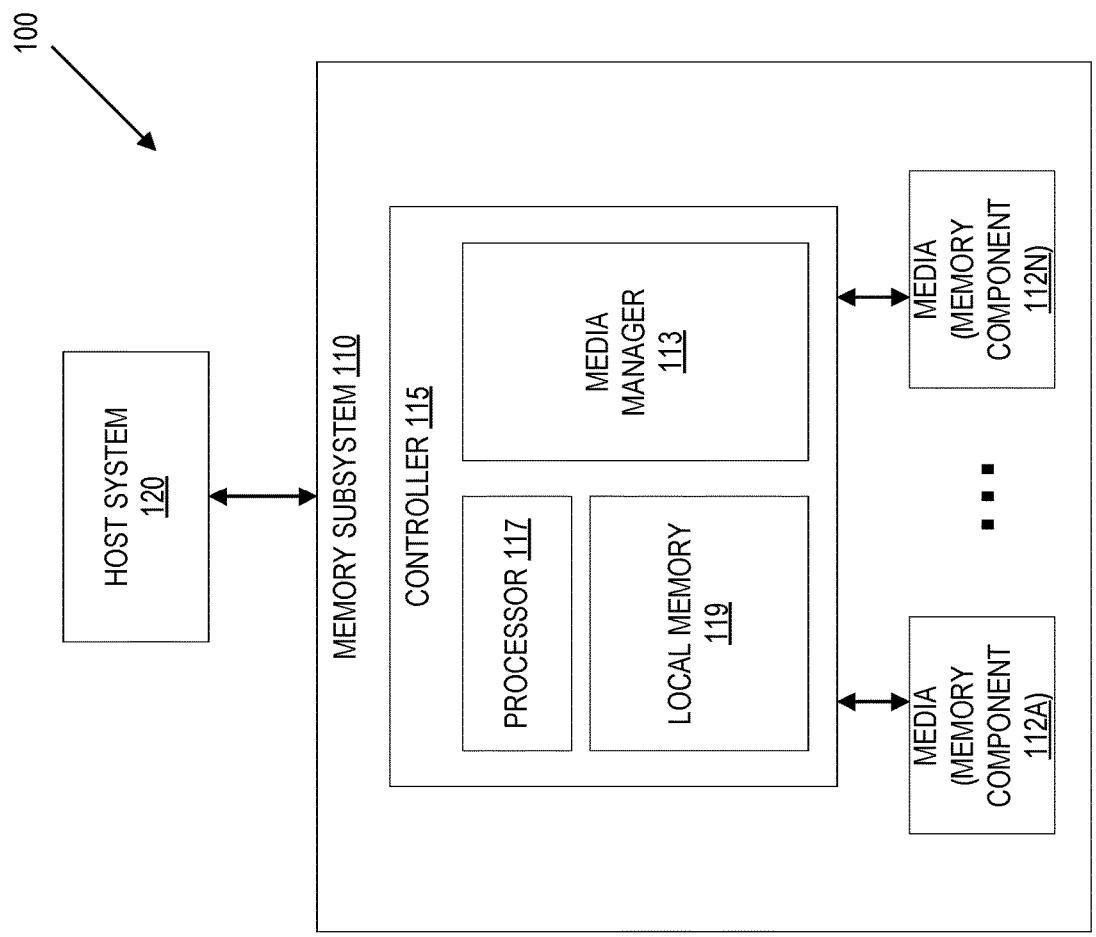
FIG. 1 illustrates an example computing environment that includes a memory subsystem, in accordance with some embodiments of the present disclosure.

Aspects of the present disclosure are directed to detecting and remediating read disturbance effects in a memory sub-system. A memory subsystem is also hereinafter referred to as a "memory device". An example of a memory sub-system is a memory module that is connected to a central processing unit (CPU) via a memory bus. Examples of memory modules include a dual in-line memory module (DIMM), a small outline DIMM (SO-DIMM), a non-volatile dual in-line memory module (NVDIMM), etc. Another example of a memory sub-system is a storage device that is connected to the central processing unit (CPU) via a peripheral interconnect (e.g., an input/output bus, a storage area network). Examples of storage devices include a solid-state drive (SSD), a flash drive, a universal serial bus (USB) flash drive, and a hard disk drive (HDD). In some embodiments, the memory subsystem is a hybrid memory/storage subsystem. In general, a host system can utilize a memory subsystem that includes one or more memory components, including those that utilize phase change memory cells with variable resistance materials. The host system can provide data to be stored at the memory subsystem and can request data to be retrieved from the memory subsystem.

As noted above, the memory subsystem can include memory components that utilize phase change memory cells with variable resistance materials. These phase change memory cells represent data by placing corresponding variable resistance materials in different phases. For example, an amorphous phase corresponds to a binary value of "0" or False (i.e., a reset/unset state) and a crystalline phase corresponds to a binary value of "1" or True (i.e., a set state). In some embodiments, the memory subsystem uses electrodes of phase change memory cells for determining a phase of the variable resistance material and thus determine a binary value represented by the current phase of the variable resistance material. For instance, electrodes of the phase change memory cell can be coupled to a selector and the selector can act as a switch to selectively allow a variable voltage across the variable resistance material to determine the phase of the phase change memory cell.

The above technique for reading data from or otherwise represented by phase change memory cells can lead to a read disturbance phenomenon. In particular, repeated reads to the same phase change memory cell without an interleaving write can cause the variable resistance material of the phase change memory cell to change resistivity and eventually be sensed as if the phase change memory cell were programmed to an alternative phase. This read disturbance phenomenon leads to a higher raw bit error rate (RBER) for phase change memory cells that are initially set (i.e., represent a binary value of "1") but, through repeated read operations, erroneously become unset (i.e., represent a binary value of "0")). When the RBER of a codeword meets or exceeds an RBER threshold, remediation can be performed to correct for storage issues with the codeword in phase change memory cells.

Conventionally, remediation for a codeword for an RBER that meets or exceeds an RBER threshold can include rewriting the codeword to the phase change memory cells (e.g., writing the corrected codeword returned from an error correcting code (ECC) decoder to the phase change memory cells). Although rewriting the phase change memory cells corrects for disturbance errors, there are many possible causes of bit errors affecting RBER and rewriting phase change memory cells may not correct for certain other possible causes (e.g., structural issues with the phase change memory cells are not corrected through rewrite of the phase change memory cells). Thus, even after rewriting the phase change memory cells, errors in the codeword can persist in corresponding phase change memory cells for which read disturbances were not the cause of errors affecting RBER (or at least were not the sole cause of errors).

These unnecessary rewrites result in wasted power (e.g., power used for rewrites that possibly do not improve or reduce RBER below the RBER threshold), reduced/poorer transaction quality-of-service (QoS) (e.g., time delays observed/endured by other transactions waiting on shared resources consumed by superfluous rewrites), and/or reduced endurance of the phase change memory cells (e.g., phase change memory cells have a write endurance that is considerably lower than a read endurance and unnecessary rewrites result in a shortened/reduced endurance for the phase change memory cells without improving or reducing RBER below the RBER threshold). Rewrite operations can also disturb neighboring phase change memory cells, which can introduce disturbances to these neighboring phase change memory cells, which can require further remediation. The above impacts can be particularly evident when the number of non-read disturbance errors for a codeword themselves meet the RBER threshold, causing a rewrite after every read operation. These rewrite operations for each read operation can themselves cause structural defects to the phase change memory cells (i.e., non-read disturbance errors), which continue to cause unnecessary writes/rewrites to the phase change memory cells.

To address the above issues, a set of data structures and methods for using the same are introduced herein to identify bit errors that are not the result of read disturbances (i.e., non-read disturbance errors) or are otherwise not correctable through a rewrite operation. Using these data structures and methods, embodiments selectively modify or bias the RBER threshold such that rewriting phase change memory cells is performed when such rewriting remediation can impact RBER of the phase change memory cells while avoiding unnecessary rewrites.

FIG. 1 illustrates an example computing environment 100 that includes a memory subsystem 110 in accordance with some embodiments of the present disclosure. The memory subsystem 110 can include media, such as memory components 112A to 112N. The memory components 112A to 112N can be volatile memory components, non-volatile memory components, or a combination of such. In some embodiments, the memory subsystem is a storage system. An example of a storage system is an SSD. In some embodiments, the memory subsystem 110 is a hybrid memory/storage subsystem. In general, the computing environment 100 can include a host system 120 that uses the memory subsystem 110. For example, the host system 120 can write data to the memory subsystem 110 and read data from the memory subsystem 110.

The host system 120 can be a computing device such as a desktop computer, laptop computer, network server, mobile device, or such computing device that includes a memory and a processing device. The host system 120 can include or be coupled to the memory subsystem 110 so that the host system 120 can read data from or write data to the memory subsystem 110. The host system 120 can be coupled to the memory subsystem 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory subsystem 110. The host system 120 can further utilize an NVM Express (NVMe) interface to access the memory components 112A to 112N when the memory subsystem 110 is coupled with the host system 120 by the PCIe interface. The physical host interface can provide an interface for passing control, address, data, and other signals between the memory subsystem 110 and the host system 120.

The memory components 112A to 112N can include any combination of the different types of non-volatile memory components and/or volatile memory components. An example of non-volatile memory components includes a negative-and (NAND) type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 120. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as memory pages or data blocks that can refer to a unit of the memory component used to store data.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or another suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory subsystem 110, including handling communications between the memory subsystem 110 and the host system 120. In some embodiments, the local memory 119 can include memory registers storing memory pointers, fetched data, etc. The local memory 119 can also include read-only memory (ROM) for storing micro-code. While the example memory subsystem 110 in FIG. 1 has been illustrated as including the controller 115, in another embodiment of the present disclosure, a memory subsystem 110 may not include a controller 115, and may instead rely upon external control (e.g., provided by an external host, or by a processor or controller separate from the memory subsystem).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory subsystem 110 can also include additional circuitry or components that are not illustrated. In some embodiments, the memory subsystem 110 can include a cache or buffer (e.g., DRAM) and address circuitry (e.g., a row decoder and a column decoder) that can receive an address from the controller 115 and decode the address to access the memory components 112A to 112N.

The memory subsystem 110 includes a media manager 113 that can manage the memory components 112A to 112N, including drift memory management and read disturbance remediation components. In some embodiments, the controller 115 includes at least a portion of the media manager 113. For example, the controller 115 can include a processor 117 (processing device) configured to execute instructions stored in local memory 119 for performing the operations described herein. In some embodiments, the media manager 113 is part of the host system 120, an application, or an operating system.

As noted above, the memory components 112A to 112N may be resistance memory components such that each of the memory cells that make up the memory components 112A to 112N is a resistance memory cell. For example, each memory components 112A to 112N can represent a die providing three-dimensional phase change material and switching (PCMS) memory. In such an embodiment, each of the memory cells of the memory components 112A to 112N is a phase change memory cell.

A phase change memory cell (e.g., in a memory component 112A to 112N) may be constructed over a substrate, having a variable resistance material formed between a bottom electrode and a top electrode. One type of variable resistance material can be amorphous silicon doped with V, Co, Ni, Pd, Fe and Mn. Another type of variable resistance material can include perovskite materials such as Pr(1-x)CaxMnO3 (PCMO), La(1-xCaxMnO3(LCMO), LaSrMnO3 (LSMO), or GdBaCoxOy (GBCO). Still another type of variable resistance material can be a doped chalcogenide glass of the formula AxBy, where B is selected from among S, Se and Te and mixtures thereof, and where A includes at least one element from Group III-A (B, Al, Ga, In, Tl), Group IV-A (C, Si, Ge, Sn, Pb), Group V-A (N, P, As, Sb, Bi), or Group VII-A (F, Cl, Br, I, At) of the periodic table, and with the dopant being selected from among the noble metals and transition metals, including Ag, Au, Pt, Cu, Cd, Ir, Ru, Co, Cr, Mn or Ni. Yet another type of variable resistance material includes a carbon-polymer film comprising carbon black particulates or graphite, for example, mixed into a plastic polymer. The material used to form bottom and top electrodes of phase change memory cells may be selected from a variety of conductive materials, such as tungsten, nickel, tantalum, titanium, titanium nitride, aluminum, platinum, or silver, among others.

In one embodiment, the variable resistance material can be in an amorphous phase or a crystalline phase. The resistance of the variable resistance material is different when in the amorphous phase in comparison to when in the crystalline phase. In particular, the variable resistance material has a higher resistivity when in the amorphous phase than when in the crystalline phase. As described herein, the phase of the variable resistance material, and by extension the resistivity of the variable resistance material, may be equated, linked, or otherwise associated with a binary value. In one example embodiment, the amorphous phase with a first resistivity (or first resistivity range) corresponds to a binary value of "0" or False (i.e., a reset/unset state) and the crystalline phase with a second resistivity (or second resistivity range) corresponds to a binary value of "1" or True (i.e., a set state). In other embodiments, the association between phases/resistivity of the variable resistance material and binary values can be switched/flipped.

Although variable resistance materials have been described as having only two phases (e.g., an amorphous phase and a crystalline phase), in other embodiments, variable resistance materials can have more than two phases. For example, a variable resistance material can have a single amorphous phase and two crystalline phases (e.g., cubic and hexagonal crystalline phases). For purposes of explanation, the variable resistance materials used herein will be described in relation to two phases (e.g., an amorphous phase and a crystalline phase); however, the systems, methods, and devices described herein may operate similarly when the variable resistance materials have more than two phases.

The transition from one phase to another phase (e.g., from the amorphous phase to the crystalline phase or from the crystalline phase to the amorphous phase) occurs in response to temperature changes of the variable resistance material. The temperature changes (i.e., heating and cooling) may be caused by passing differing strengths of current through the variable resistance material. For example, the electrodes of the phase change memory cell can place the variable resistance material in a crystalline phase by passing a crystallizing current through the variable resistance material, thus warming the variable resistance material to a temperature wherein a crystalline structure may grow. The electrodes can use a stronger melting current to melt the variable resistance material for subsequent cooling to the amorphous phase. When the phase change memory cell uses the crystalline phase to represent a binary value of "1" or True and the amorphous phase to represent a binary value of "0" or False, the crystallizing current can be referred to as a write or set current and the melting current can be referred to as an erase or reset/unset current. However, as described above, the assignment of phases to binary values can be switched.

In one embodiment, the memory subsystem 110 uses the electrodes of the phase change memory cell for determining a phase of the variable resistance material and thus determine a binary value represented by the current phase of the variable resistance material. For example, the electrodes of a phase change memory cell can be coupled to a selector and the selector can act as a switch to selectively allow a variable voltage across the variable resistance material. When the resistivity of the variable resistance material is high (i.e., the variable resistance material is in an amorphous phase), the voltage used must be sufficiently high to overcome the resistivity of the variable resistance material. If the voltage is not sufficiently high, current will not pass through the variable resistance material and the selector will snap back open. In contrast, when the variable resistance material has a lower resistivity (e.g., the variable resistance material is in a crystalline phase), the same voltage that was not able to pass through the variable resistance material when at a higher resistivity (e.g., the variable resistance material is in the amorphous phase) will pass through the variable resistance material without snapping the selector back open (i.e., the selector remains closed). Thus, applying a current with a specific voltage allows the phase of the variable resistance material to be determined such that data stored in or represented by the variable resistance material can be read.

Although the variable resistance material of a phase change memory cell is described above as having a discrete resistivity while in a corresponding phase, the resistivity of the variable resistance material may be within a corresponding amorphous range or a crystalline range. In particular, a phase change memory cell may be considered in the amorphous phase when the resistivity of the phase change memory cell is within an amorphous range and is in the crystalline phase when the resistivity of the phase change memory cell is within a crystalline range. The resistivity of the phase change memory cell may be unintentionally altered over time based on a number of factors, including read operations on the phase change memory cell and write operations to neighboring cells. These unintentional resistivity changes may ultimately result in corresponding unintentional phase changes leading to an increased raw bit error rate (RBER). For example, when a selector applies a current across a variable resistance material of a phase change memory cell in an attempt to sense the phase of the phase change memory cell (i.e., perform a read operation), the applied current may incrementally alter the resistivity of the variable resistance material of a phase change memory cell. While a single read operation may cause a minor resistivity change, many read operations (e.g., thousands, tens of thousands, hundreds of thousands, etc.) may greatly alter the resistivity of a phase change memory cell to the point where the phase of phase change memory cell has also been altered (e.g., the resistivity of the phase change material has moved from the crystalline range into the amorphous range). This disturbance phenomenon is particularly prevalent/dominant for changes between a crystalline phase and an amorphous phase (e.g., errors in which a phase change memory cell changes from set to reset/unset) as the current spike from repeated read operations acts as a soft or weak reset/unset, which weakly mimics the reset/unset pulse used to program the cell to the reset/unset state.

In one case, when a codeword is read from phase change memory cells, the RBER of the read codeword is determined and compared against an RBER threshold. For example, the memory subsystem 110 (and, in particular, the media manager 113 of the memory subsystem 110) may set an RBER threshold to four. When a codeword is read from phase change memory cells, an error correcting code (ECC) decoder corrects the read codeword for errors to produce a corrected codeword and may also indicate that five bits were corrected. In this example, the RBER for the codeword is above the RBER threshold (i.e., the RBER of five is greater than the RBER threshold of four) such that remediation can be performed on the codeword stored in the phase change memory cells. Remediation can include rewriting the codeword to the phase change memory cells (e.g., writing the corrected codeword returned from the ECC decoder to the phase change memory cells). Rewriting alleviates any read disturbance errors by placing the phase change memory cells in their correct phases with corresponding resistivity.

Although rewriting the phase change memory cells corrects for disturbances, there are many possible causes of bit errors reflected in an RBER value and rewriting phase change memory cells may not correct for certain other possible causes of RBER (e.g., structural issues with the phase change memory cells are not corrected through rewrite of the phase change memory cells). Thus, even after rewriting, errors in the codeword may persist in corresponding phase change memory cells for which read disturbances were not the cause of errors (or at least were not the sole cause of errors).

Some RBER remediation methods do not distinguish between causes of bit errors and instead assume that all bit errors can be corrected by rewriting the phase change memory cells. Namely, ECC decoders return the total number of corrected bit errors without an indication of the possible causes of these bit errors or any indication of directionality of these bit errors, as the ECC decoders are unaware of the causes. When bit errors that result in the codeword exceeding the RBER threshold are at least partially based on causes that cannot be remediated through rewrites (e.g., non-read disturbance errors/causes, such as structural defects of the phase change memory cells), rewriting of the codeword may be unnecessary and ineffective. These unnecessary/ineffective rewrites result in wasted power (e.g., power used for rewrites that possibly do not improve/reduce RBER below the RBER threshold), reduced/poorer transaction quality-of-service (QoS) (e.g., time delays observed/endured by other transactions waiting on shared resources consumed by superfluous rewrites), potentially disturbing neighboring cells, and/or reduced endurance of the phase change memory cells (e.g., phase change memory cells have a write endurance that is considerably lower than a read endurance and unnecessary rewrites result in a shortened/reduced endurance for the phase change memory cells without improving/reducing RBER below the RBER threshold). The above impacts may be particularly evident when non-read disturbance errors themselves meet the RBER threshold (or other errors that are not correctable by a rewrite operation), causing a rewrite side effect on every read operation. These rewrite operations for each read operation may themselves cause structural defects to the phase change memory cells (i.e., non-read disturbance errors), which continue to cause unnecessary writes/rewrites to the phase change memory cells.

To address the above issues, classification of bit errors as either read disturbance errors or non-read disturbance errors can be used in modifying or biasing the RBER threshold (e.g., incrementing or decrementing the RBER threshold). As used herein, read disturbance errors can be viewed as errors that can be corrected through a rewrite of affected phase change memory cells and non-read disturbance errors can be viewed as errors that cannot be corrected through a rewrite of phase change memory cells. Accordingly, classifications can be made regarding errors that can be corrected through a rewrite of affected phase change memory cells and errors that cannot be corrected through a rewrite of phase change memory cells. As noted above, since the current applied by electrodes of the phase change memory cells acts as a soft reset/unset signal, read disturbances only involve bits erroneously transitioning between set and unset (i.e., transitioning between the binary value "1" and the binary value "0"), which are sometimes referred to unset errors or reset errors. Thus, erroneous bit transitions between unset and set (i.e., transitioning between the binary value "0" and the binary value "1"), which are sometimes referred to as set errors, can be excluded from the RBER provided by an ECC decoder or otherwise accounted for when determining to performed rewrite remediation. In one embodiment, the ECC decoder can differentiate between unset errors and set errors through transforms of the raw data processed by the ECC decoder and the corrected data output by the ECC decoder.

For example, for raw data (R) stored in the phase change memory cells and corrected data (C) output/generated by an ECC decoder, when the logical result of [(C XOR R) AND R]=1, the bit error is a set error and when the logical result of [(C XOR R) AND C]=1, the bit error is an unset error. In this example, categorization/classification of bit errors can be performed without requiring an additional read of the phase change memory cells (i.e., without multiple reads of the phase change memory cells). Although described as the ECC decoder providing/calculating the categorization/classification of bit errors, in some embodiments, the categorization/classification of bit errors may alternatively be provided/calculated by a channel buffering agent.

Although the above approach may be useful in determining which bit errors are associated with read disturbances (i.e., identified set errors are not caused by read disturbances), this approach does not indicate which of the identified unset errors are caused by read disturbances. Ideally, determining which bits/phase change memory cells are stuck in the binary value "0" (i.e., unset) or are otherwise predisposed to incorrectly sense at the binary value "0" due to intrinsic weakness instead of extrinsic read disturbance effects, can be used to exclude these bits from bit error/remediation considerations and/or alter the RBER threshold.

In one embodiment, a read from the phase change memory cells can be performed after rewriting the codeword to the phase change memory cells. In this embodiment, unset bit errors corrected by the rewrite are likely to be read disturbance errors (i.e., induced by repeated reads of the phase change memory cells). Conversely, unset bit errors not corrected by the rewrite are likely to be non-read disturbance errors (e.g., bit errors caused by structural issues with the phase change memory cells). In some embodiments, the number of unset bit errors that are not corrected by the rewrite can be captured and used as a bias/modification parameter for the RBER threshold for future possible remediations/rewrites of the phase change memory cells. However, this bias only applies if the next codeword written into these phase change memory cells, which were not corrected by the rewrite, also stores binary values of "1". Unfortunately, this cannot be guaranteed as the controller 115 cannot ensure that the affected/problematic bit position is always set (e.g., a binary value of "1") for every subsequent codeword. However, these non-read disturbance errors (e.g., bit errors caused by structural issues with the phase change memory cells) can be addressed by abstracting the bias such that it represents a generalized "higher bar" for invoking the refresh rewrite with a cap on the bias. The bias metric can be stored in metadata outside of the phase change memory cells per-codeword, per sector, or per sector group.

In some embodiments, a resistivity drift period of the phase change memory cells is considered for reads after a write. In particular, although the variable resistance material of a phase change memory cell is described above as being in one phase or another (e.g., metastable in an amorphous phase or a crystalline phase) and having a discrete resistivity while in that corresponding phase, the resistivity of the variable resistance material may be in constant transition or may be constantly drifting. Namely, the resistivity of the variable resistance material may vary (i.e., decelerate) over time as it attempts to settle. The rate of the change is highest when the variable resistance material is initially written to a particular phase and the rate of change is reduced over time until a constant rate of resistivity change is reached (e.g., after the passage of a few hundred seconds). The rate of resistivity change can be dependent on the phase of the variable resistance material. For example, when the variable resistance material of a phase change memory cell is in the crystalline phase (i.e., the phase change memory cell is set) the rate of resistivity change can be higher than when the variable resistance material is in the amorphous phase (i.e., the phase change memory cell is reset/unset).

This changing resistivity results in difficulty with reading these phase change memory cells until a resistivity drift period has elapsed and a constant rate of resistivity change is reached or the resistivities of the various phases are far enough apart to be reliably differentiated by a sense operation. Since reading phase change memory cells during the resistivity drift period provides low fidelity, with undesirable side effects, writes to the phase change memory cells may be buffered in a drift buffer for the duration of the resistivity drift period. Reads for recent writes that are received during this resistivity drift period are fulfilled using the drift buffer instead of reading directly from recently written phase change memory cells. Several embodiments are described below for modifying this drift buffer to classify bit errors as read disturbance errors and/or non-read disturbance errors.

Figure 2A:
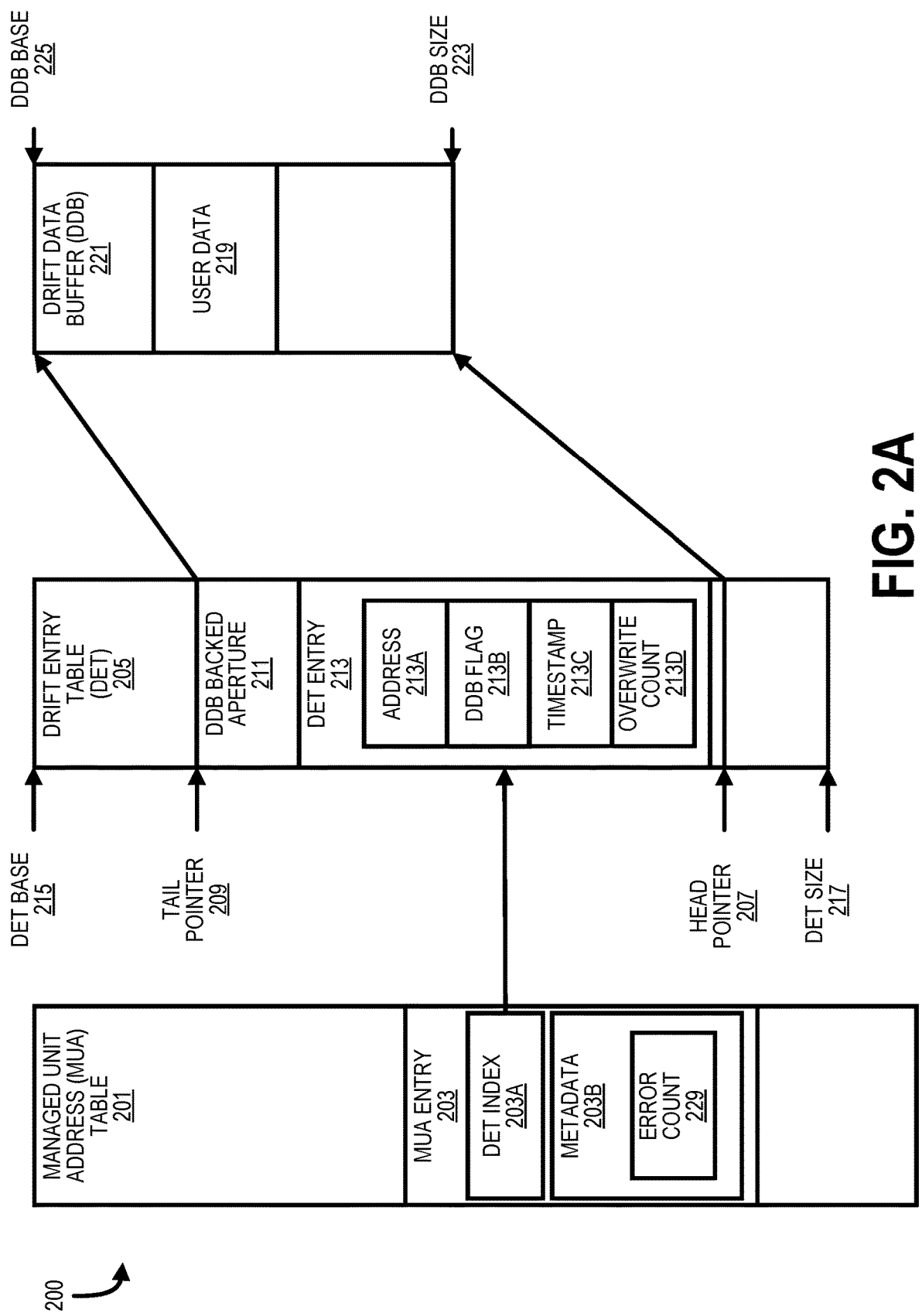
FIG. 2A shows a set of hierarchical data structures for accessing data from phase change memory cells, including an error count stored in a Managed Unit Address (MUA) table, in accordance with one or more embodiments.

FIG. 2A shows a set of hierarchical data structures 200 for accessing user data from phase change memory cells according to one example embodiment. In particular, the set of hierarchical data structures 200 allow for the determination of read disturbances for biasing/adjusting an RBER threshold while accounting for a resistivity drift period of phase change memory cells. The hierarchical data structures 200 can be stored in the local memory/storage 119 or any other location in the controller 115. In some embodiments, the media manager 113 uses the hierarchical data structures 200 for managing access to the phase change memory cells in an efficient manner by caching/storing user data and/or parity bits in addition to metadata for user data stored in the memory components 112A to 112N, as will be described in greater detail below.

As shown in FIG. 2A, the hierarchical data structures 200 include a Managed Unit Address (MUA) table 201. The MUA table 201 can be used for indicating the location of data in a memory hierarchy. In one embodiment, the MUA table 201 includes MUA entries 203 corresponding to different phase change memory cells or groups of phase change memory cells. In one embodiment, the media manager 113 or a component of the local memory/storage 119 indexes the MUA entries 203 based on an address of the phase change memory cells (e.g., indexed based on MUA addresses for the phase change memory cells). Although described as indexing based on an MUA address, the MUA entries 203 can be indexed using a logical index rather than physical index. In particular, an access request from a host system 120 can provide a logical address. The media manager 113 uses the logical address to index the MUA table 201 (e.g., the media manager 113 can function to provide address translation). For example, the media manager 113 via the MUA table 201 can identity map that logical address to a physical address (i.e., a group of phase change memory cells in the topology) or the media manager 113 can redirect that logical address to some non-identity mapped address for a group of phase change memory cells, supporting indirection between logical and physical.

The MUA table 201 references or points to a Drift Entry Table (DET) 205. For example, the MUA table 201 can include data corresponding to a head pointer 207 and a tail pointer 209 of a Drift Data Buffer (DDB) backed aperture 211 in the DET 205 (i.e., the in-use portion of the DET 205). Further, each of the MUA entries 203 can include a DET index 203A and/or metadata 203B. In one embodiment, the metadata 203B stores an indication to reread the user data 219 corresponding to a codeword after a resistivity drift period has elapsed (e.g., zero seconds to one-milliseconds since the phase change memory cell has been written), while the DET index 203A of an MUA entry 203 is an offset (e.g., a pointer) to a DET entry 213 in the DDB backed aperture 211 of the DET 205. An MUA entry 203 can have a DET index 203A if a set of phase change memory cells corresponding to the MUA entry 203 was written within the resistivity drift period. Each DET index 203A points to a single DET entry 213 such that the DET indices 203A and the DET entries 213 share a one-to-one relationship.

Each DET entry 213 can include various pieces of data. For example, in some embodiments, each DET entry 213 includes one or more of an address 213A (e.g., an MUA address corresponding to the MUA entry 203 and consequently the phase change memory cells associated with the MUA entry 203); a DDB flag 213B indicating whether user data 219 associated with the phase change memory cells have been stored/cached in the hierarchical data structures 200 (e.g., when the DDB flag 213B is set to true, user data 219 for the associated phase change memory cells is stored/cached in the hierarchical data structures 200); a write timestamp 213C indicating when the associated phase change memory cells were last written for use in determining disturbance effects to the phase change memory cells relative to time; and an overwrite count 213D indicating the number of times associated phase change memory cells have been overwritten for use in determining portions of the memory components 112A to 112N that have been heavily overwritten and develop excessive wear or hotspots.

As noted above, the MUA table 201 can include data corresponding to a head pointer 207 and a tail pointer 209 of the DDB backed aperture 211. In particular, although the DET 205 can have a DET base 215 and a DET size 217 that may be fixed, the used portion of the DET 205 (i.e., the portion of the DET 205 that is being referenced by MUA entries 203 in the MUA table 201 and corresponds to the DDB backed aperture 211) can vary. Specifically, as noted above, MUA entries 203 can only have DET indices 203A when corresponding phase change memory cells have been recently written. Thus, when the memory subsystem 110 first turns-on and/or a corresponding host system 120 first boots, the phase change memory cells may all have been written outside a relevant window of interest. Thus, the DET 205, and in particular the DDB backed aperture 211, may be empty.

As shown in FIG. 2A, the data corresponding to the head pointer 207 can be a pointer corresponding to the beginning of the DDB backed aperture 211 in the DET 205 and the data corresponding to the tail pointer 209 can be a pointer corresponding to the end of the DDB backed aperture 211 in the DET 205. In one embodiment, the head pointer 207 references an unused DET entry 213, whereas the tail pointer 209 can reference a used DET entry 213 (with the exception when the DET 205 is empty and the tail pointer 209 must reference an unused DET entry 213). When the DET 205, and in particular the DDB backed aperture 211, is empty, the head pointer 207 and the tail pointer 209 are equal and reference the first DET entry 213 (i.e., a DET entry 213o). Updates to the head pointer 207 and the tail pointer 209 can be made modulus the DET size 217 to ensure the head pointer 207 and the tail pointer 209 remain in the range of the DET 205.

The DET 205, and accordingly the DDB backed aperture 211, is considered full when the difference between the head pointer 207 and the tail pointer 209 is equal to one less than the DET size 217. Based on this correspondence, the DET size 217 may be a power of two for optimization (i.e., produces optimized results for modulus/divide operations as the modulus/divide operation may be performed using a shift operation); however, in other embodiments, the DET size 217 may be of different sizes not tied to a power of two. The DET 205 will likely remain in a full state constantly as DET entries 213 will quickly fill the DET 205 as the controller 115 writes phase change memory cells and the media manager 113 constantly replaces DET entries 213 as time elapses and/or capacity of the DET 205 is reached (i.e., the number of DET entries 213 in the DET 205 reaches the DET size 217).

As noted above, the in-use portion of the DET 205 (i.e., the DET entries 213 between the head pointer 207 and the tail pointer 209) may be termed the DDB backed aperture 211. Each DET entry 213 can be related/associated with user data 219 in the DDB 221 as designated by a DDB offset. For example, the DDB offset (i.e., the location for user data 219 in the DDB 221) can be equal to the DET offset for the DET entry 213 modulus the DDB size 223 (i.e., the size of the DDB 221). In this example embodiment, the head or beginning of the DDB 221 is located at the DDB base 225 and the DDB 221 has a number of pieces of user data 219 equal to the DDB size 223.

The hierarchical data structures 200 may be variably sized based on the stability of the of phase change memory cells of the memory components 112A to 112N. For example, the DDB 221 can be sized to always buffer user data 219 for the last one-hundred milliseconds of data writes to the memory components 112A to 112N. At one gigabit per second write rates, the DDB 221 would have to total one-hundred megabytes or roughly twenty-five thousand user data 219 entries of four kilobytes each. Power-of-two optimizations might increase this to 32,768 user data 219 entries (i.e., $2^{15}$).

When a set of phase change memory cells are written, the media manager 113 may add a DET entry 213 to the DET 205. Additions of new DET entries 213 occur under three situations: (1) a DET entry 213 is being added to a non-full DET 205 (no overwriting necessary as the DET 205 is not full); (2) a DET entry 213 is being added to a full DET 205, but an existing DET entry 213 will not be overwritten; and (3) a DET entry 213 is being added to a full DET 205 and an existing DET entry 213 will be overwritten. In each situation, user data 219 (i.e., one or more codewords) are written to the memory components 112A to 112N (e.g., the phase change memory cells) simultaneous with the user data 219 being processed by the media manager 113. Each of the three situations listed above for adding DET entries 213 will be described below.

With respect to adding a DET entry 213 to a non-full DET 205 without overwrite, the process can commence with indexing the MUA table 201 based on an address of the phase change memory cells being written to locate the corresponding MUA entry 203. In this scenario, the located MUA entry 203 does not have an associated DET index 203A, which indicates that the phase change memory cells corresponding to the MUA entry 203 do not have a corresponding DET entry 213. Accordingly, the DET entry 213 indicated by the head pointer 207 can be used for the DET index 203A. Based on this DET entry 213, the location for user data 219 in the DDB 221 can be determined as described above (e.g., the DDB offset for the user data 219 in the DDB 221 may be equal to the DET offset for the DET entry 213 modulus the DDB size 223). The user data 219 from the write operation that precipitated this new MUA entry 203 can thereafter be written to the determined location in the DDB 221. Subsequently, the fields of the DET entry 213 can be set, including setting the DDB flag 213B to one/True and setting the overwrite count 213D to zero. As noted above, the DET index 203A for the MUA entry 203 can be set to the head pointer 207 and the head pointer 207 can be incremented to a new DET entry 213. In some embodiments, as will be described below, an error count 229 in the metadata 203B may also be set to indicate the number of errors (e.g., unset errors) in corresponding user data 219. This error count 229 can be used for determining when the user data 219 is to be reread after the resistivity drift period (e.g., one-hundred milliseconds) has elapsed and an analysis performed to determine whether an RBER threshold should be adjusted.

With respect to adding a DET entry 213 to a full DET 205 without overwriting an MUA entry 203, the process can commence with indexing the MUA table 201 based on an address of the phase change memory cells being written to locate the corresponding MUA entry 203. In this scenario, the located MUA entry 203 does not have an associated DET index 203A, which indicates that the phase change memory cells corresponding to the MUA entry 203 do not have a corresponding DET entry 213. Accordingly, the DET entry 213 indicated by the head pointer 207 can be used for the DET index 203A of the previously located MUA entry 203. In some cases, the DET entry 213 indicated by the head pointer 207 may or may not be empty. When empty, the DET entry 213 of the head pointer 207 can be used. When not empty, the MUA entry 203 referencing the used DET entry 213 can have its DET index 203A cleared such that the DET entry 213 previously referenced by the DET index 203A is now free to use. The DET entry 213 indicated by the tail pointer 209 is identified and its DDB flag 213B is cleared. The tail pointer 209 is thereafter incremented to point to the next DET entry 213. The location in the DDB 221 indicated by the head pointer 207, which is the same location indicated by the tail pointer 209 before being incremented, is identified. The user data 219 from the write operation that precipitated this new MUA entry 203 can be written to the identified location in the DDB 221. Subsequently, the fields of the DET entry 213 can be set, including setting the DDB flag 213B to one/True and setting the overwrite count 213D to zero. As noted above, the DET index 203A for the MUA entry 203 can be set to the head pointer 207 and the head pointer 207 can be incremented to a new DET entry 213. In some embodiments, as will be described below, an error count 229 in the metadata 203B may also be set to indicate the number of errors (e.g., unset errors). This error count 229 can be used for determining when the user data 219 is to be reread after the resistivity drift period (e.g., one-hundred milliseconds) has elapsed and an analysis performed to determine whether an RBER threshold should be adjusted.

With respect to adding a DET entry 213 to a full DET 205 and overwriting an MUA entry 203, the process can commence with indexing the MUA table 201 based on an address of the phase change memory cells being written to locate the corresponding MUA entry 203. In this scenario, the located MUA entry 203 does have an associated DET index 203A, which indicates that the phase change memory cells corresponding to the MUA entry 203 have a corresponding DET entry 213. Based on this DET index 203A, the DET entry 213 can be located, the overwrite count 213D associated with the DET entry 213 can be captured and the DET entry 213 can be reinitialized to be empty. The DET entry 213 indicated by the head pointer 207 can now be used for the DET index 203A. In some cases, the DET entry 213 indicated by the head pointer 207 may or may not be empty. When empty, the DET entry 213 of the head pointer 207 can be used. When not empty, the MUA entry 203 referencing the used DET entry 213 can have its DET index 203A cleared such that the DET entry 213 previously referenced by the DET index 203A is now free to use. The DET entry 213 indicated by the tail pointer 209 is identified and its DDB flag 213B is cleared. The tail pointer 209 is thereafter incremented to point to the next DET entry 213. The location in the DDB 221 indicated by the head pointer 207, which is the same location indicated by the tail pointer 209 before being incremented, is identified. The user data 219 from the write operation that precipitated this new MUA entry 203 can be written to the identified location in the DDB 221. Subsequently, the fields of the DET entry 213 can be set, including setting the DDB flag 213B to one/True and the overwrite count 213D can be set to the previously captured value and incremented by one. As noted above, the DET index 203A for the MUA entry 203 can be set to the head pointer 207 and the head pointer 207 can be incremented to a new DET entry 213. In some embodiments, as will be described below, an error count 229 in the metadata 203B may also be set to indicate the number of errors (e.g., unset errors). This error count 229 can be used for determining when the user data 219 is to be reread after the resistivity drift period (e.g., one-hundred milliseconds) has elapsed and an analysis performed to determine whether an RBER threshold should be adjusted.

Figure 2B:
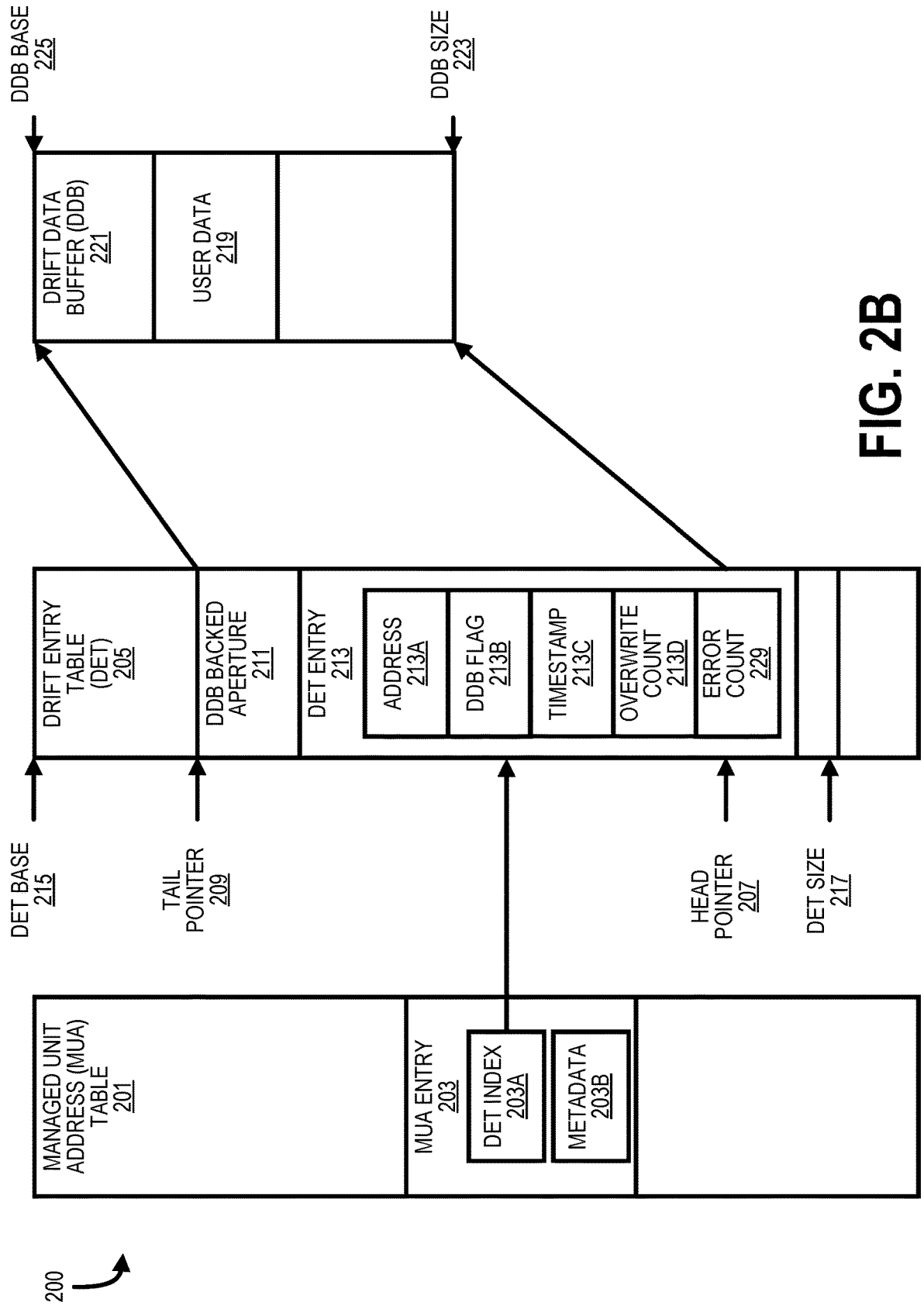
FIG. 2B shows a set of hierarchical data structures for accessing data from phase change memory cells, including an error count stored in a Drift Entry Table (DET), in accordance with one or more embodiments.
Figure 2C:
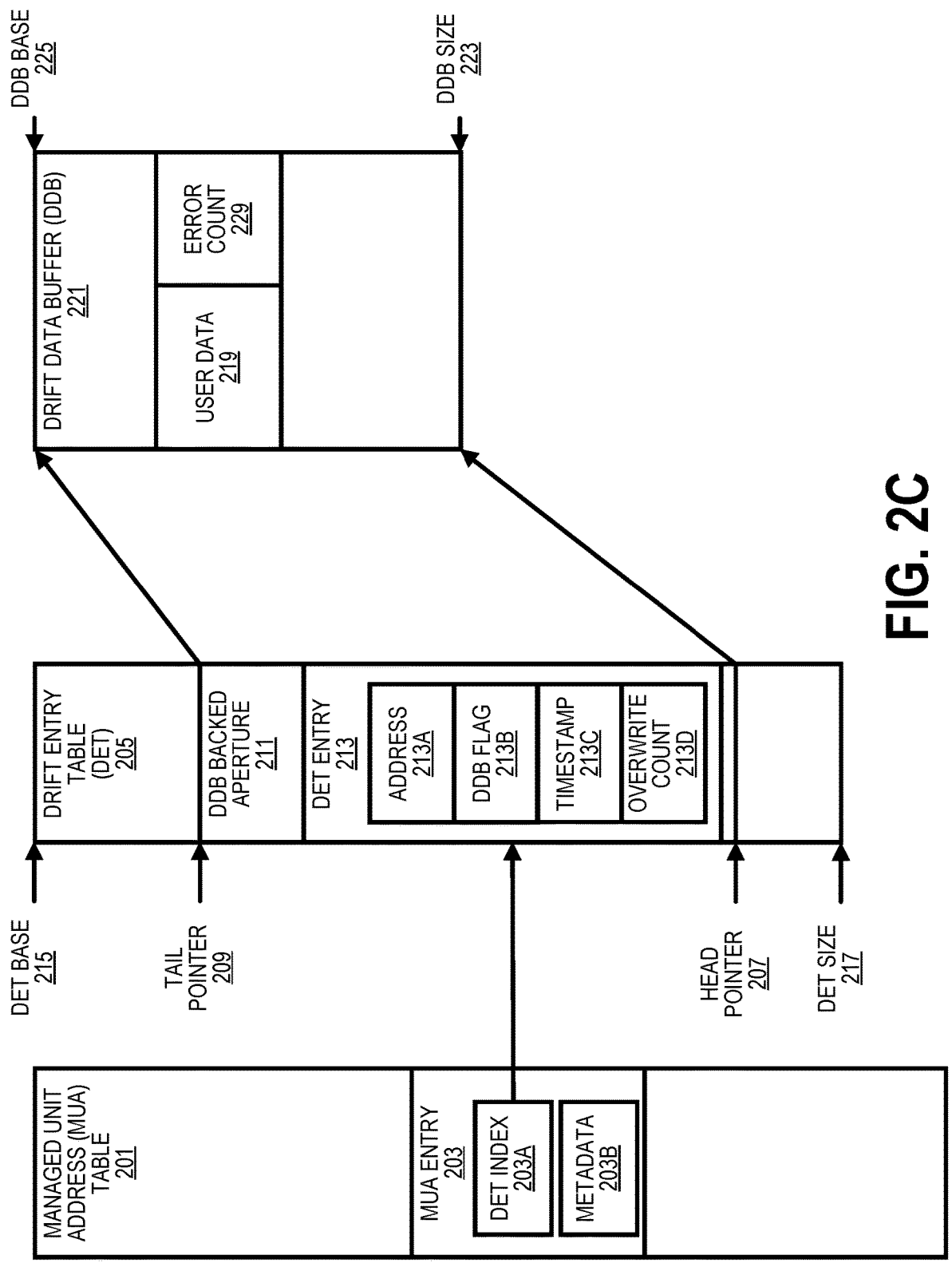
FIG. 2C shows a set of hierarchical data structures for accessing data from phase change memory cells, including an error count stored in a Drift Data Buffer (DDB), in accordance with one or more embodiments.

Although the set of hierarchical data structures 200 has been described according to the specific embodiment shown in FIG. 2A, the set of hierarchical data structures 200 may include different elements in other embodiments. For example, although the error count 229 is stored in the metadata 203B in the embodiments described above, this error count 229 may be stored in any location outside the phase change memory cells. For example, FIG. 2B shows an embodiment in which the error count 229 is stored in the DET 205. In particular, each DET entry 213 includes an error count 229 to indicate the number of errors (e.g., unset errors) in corresponding user data 219. In another embodiment, the error count 229 for the user data 219 may be stored in another data structure (i.e., separate from the MUA table 201 and the DET 205). For example, as shown in FIG. 2C, the error count 229 is present in the DDB 221. Accordingly, as shown in FIGS. 2A-2C, the set of hierarchical data structures 200 are not limited to a specific configuration.

Using the hierarchical data structures 200 shown in any one of FIGS. 2A-2C, the error count 229 indicates that the corresponding user data 219 (i.e., a set of codewords) should be reread and recorrected such that unset bit error counts can be calculated/counted. Unset bit errors that remain after the user data 219 has been rewritten to the phase change memory cells are the result of non-read disturbance errors as read disturbance errors are corrected after the rewrite operation. The count of the unset bit errors, which represent non-read disturbance errors, can be synthesized into a bias for the RBER threshold for future read disturbance evaluations of this address/phase change memory cell (e.g., the RBER threshold may be increased, decreased, or otherwise adjusted according to some function relative to the number of unset bit errors that remain after the rewrite operation). Although the above approach provides some fidelity in biasing the RBER threshold, the approach is somewhat inaccurate as it counts all remaining unset bit errors rather than restricting the count to unset bit errors that were present in the codeword when it was originally read. Accordingly, this approach may overestimate bad/weak bit counts when other transient bit errors are induced (e.g., proximity write disturbances).

To correct for the above issues, in some embodiments, the user data 219 in the DDB 221 may include the raw/uncorrected data from the phase change memory cells, including parity bits, instead of corrected data. In situations where a read request for the user data 219 at a corresponding address 213A is received prior to the expiration of the resistivity drift period, user data 219, which includes raw/uncorrected data, is processed by an ECC decoder to produce corrected data that is provided to a requesting host system 120. In some embodiments, determining whether the user data 219 includes raw data or corrected data may be facilitated using the error count 229. Namely, when the error count 229 is greater than zero, the user data 219 stores raw data and should be corrected before fulfilling a read request from a host system 120. Conversely, when the error count 229 is equal to zero, the user data 219 stores correct data and does not need to be corrected before fulfilling a read request from a host system 120. By storing the raw/uncorrected data, no additional state information is required to calculate bit errors during a reread operation, which is triggered when a remediated/rewrittten codeword is expired/evicted/rolled out of the DET 205 and/or the DDB 221 to be reread automatically.

To facilitate a quick assessment of the residual unset errors, a modified version of the raw data may be stored/buffered in the DDB 221 (i.e., stored/buffered in the user data 219). In particular, since set errors are not of importance for determining read disturbances, set errors can be masked out of the raw data stored in the user data 219. Accordingly, the raw data only includes unset errors, while still being correctable by an ECC decoder. This allows the performance of a raw comparison with the data stored in the phase change memory cells (e.g., an exclusive-or between the raw data stored in the user data 219 and the raw data stored in the phase change memory cells) instead of a corrected comparison with the data stored in the phase change memory cells.

In the embodiments described herein in which raw data is stored in the DDB 221, the user data 219 field is increased in size in comparison to embodiments in which corrected data is stored in the DDB 221. The larger size for the user data 219 field accommodates parity bits, which are used by an ECC decoder for correcting errors in raw data to produce/generate corrected data.

Figure 3A:
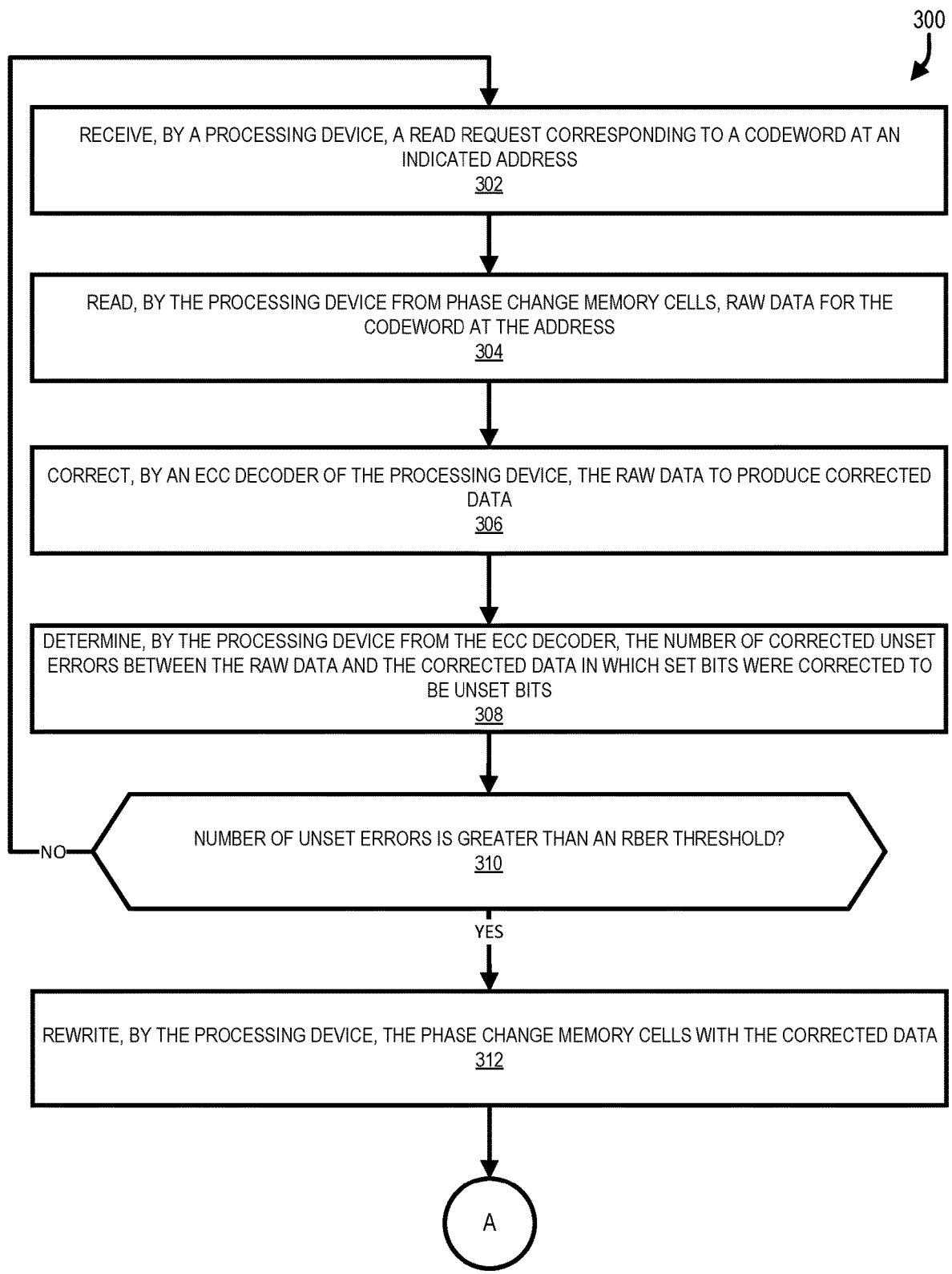
FIGS. 3A-3C present a flow diagram of an example method to efficiently remediate read disturbances to phase change memory cells in view of resistivity drift issues in accordance with some embodiments of the present disclosure.
Figure 3B:
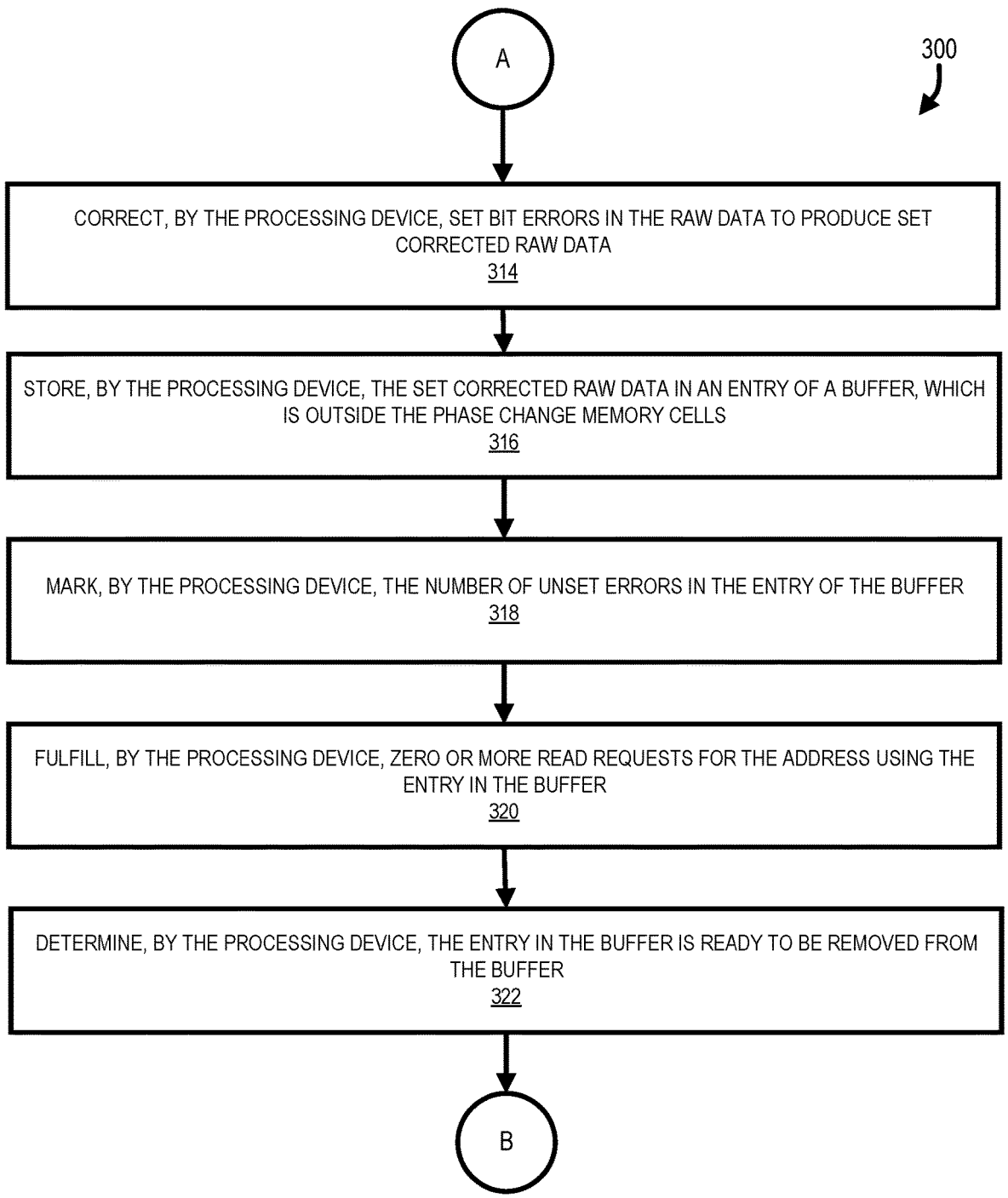
Figure 3C:
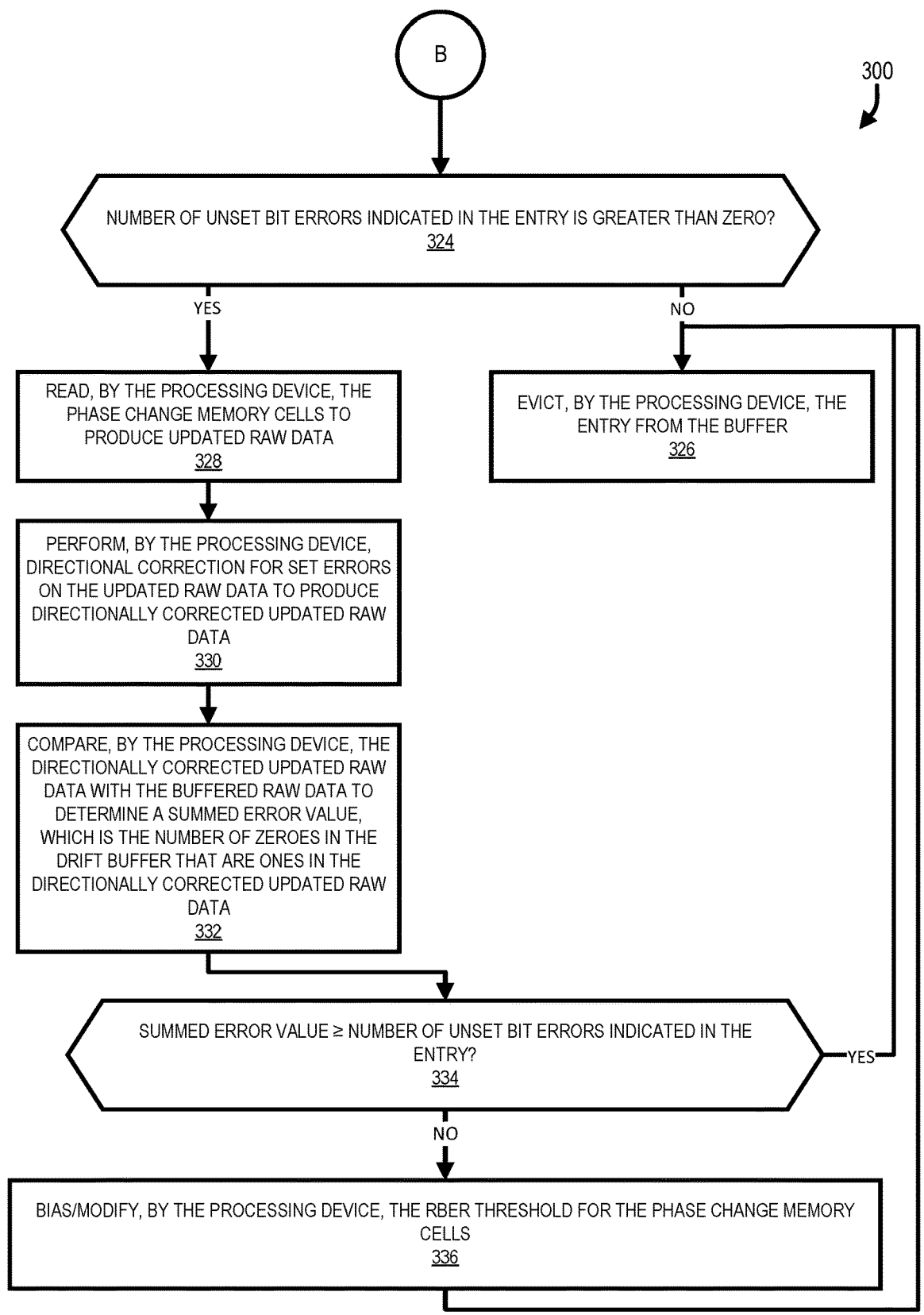

Turning now to FIGS. 3A-3C, the hierarchical data structures 200 of FIGS. 2A-2C and the media manager 113 of FIG. 1 will now be described below in reference to the method 300. FIGS. 3A-3C present a flow diagram of an example method 300 to efficiently remediate read disturbances to phase change memory cells in view of non-read disturbance and resistivity drift issues in accordance with some embodiments of the present disclosure. In particular, the method 300 allows for the determination of which bit errors are the result of read disturbances and which bit errors are the result of non-read disturbances for potentially biasing an RBER threshold such that rewrite remediation of corresponding phase change memory cells may be efficiently performed. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the media manager 113 of FIG. 1 in conjunction with the hierarchical data structures 200 of any one of FIGS. 2A-2C.

Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

As shown in FIG. 3A, the method 300 commences at operation 302 with a processing device receiving a read request from a host system 120 for a codeword/user data at a particular address. For example, the host system 120 may transmit a read request for a codeword to the memory subsystem 110. The read request includes an address of the codeword and is received by a host interface (not shown) of the memory subsystem 110. The host interface of the memory subsystem 110 may decode the read request to reveal the address of the codeword and forwards the address to the controller 115 and the media manager 113 (e.g., the processing device).

At operation 304, the processing device reads raw data from the phase change memory cells of the memory components 112A to 112N at the indicated address. As used herein, raw data describes the exact bit values currently represented in the phase change memory cells of the memory components 112A to 112N. These bit values may be different from values previously written to the phase change memory cells. Namely, bit errors, which cause alterations to bit values (i.e., cause phase change memory cells to change from set to unset and/or from set to unset) have been introduced to phase change memory cells. For example, one or more disturbances or other causes can contribute to altering bit values previously written to the phase change memory cells. As noted above, one such disturbance is a read disturbance phenomenon by which repeated reads to the same phase change memory cell can cause the corresponding variable resistance material to change resistivity and eventually be sensed as if the phase change memory cell were programmed to an alternative phase. Other causes of bit errors include structural issues with the phase change memory cells.

At operation 306, the processing device corrects the raw data of operation 304 to generate corrected data. The processing device can employ parity bits that are part of the raw data and stored in the phase change memory cells to produce/generate corrected data. For example, an ECC decoder of the processing device uses parity bits to correct for one or more bit errors in the raw data read from the phase change memory cells of the memory components 112A to 112N at operation 304.

At operation 308, the processing device determines the number of unset bit errors corrected by the ECC decoder at operation 306. As noted above, unset bit errors are bits/phase change memory cells that have erroneously changed from set to unset (i.e., bits that have a value of "1" in the corrected data but have a value of "0" in the raw data). Accordingly, the processing device determines the number of set bits in the raw data read at operation 304 that were corrected to be unset at operation 306. In some embodiments, one of the ECC decoder and a channel agent of the memory components 112A to 112N determines at operation 308 the number of unset errors corrected at operation 306. For example, the corrected data can have the bit sequence "1101 0101" and the raw data can have the bit sequence "0010 1111". In this example, the processing device determines at operation 308 that the raw data includes three unset bit errors.

At operation 310, the processing device determines whether the number of unset bit errors corrected by the ECC decoder is greater than an RBER threshold. The RBER threshold indicates the number of bit errors allowed to be corrected in a codeword before remediation of the phase change memory cells, in which the codeword is stored, is performed. For example, the memory subsystem 110 (and, in particular, the processing device of the memory subsystem 110) may set an RBER threshold to two. In this example, when the number of unset bit errors corrected by the ECC decoder is less than or equal to two, the method 300 moves back to operation 302 to process another read request. Namely, when the number of unset bit errors corrected by the ECC decoder is less than or equal to the RBER threshold, the phase change memory cells have not encountered a significant number of read disturbances to warrant remediation (e.g., rewriting the phase change memory cells). In contrast, using the above example set of bit sequences, when the number of unset bit errors corrected by the ECC decoder is greater than two, the method 300 moves to operation 312. In particular, in the above example where the number of unset bit errors is determined to be three for the corrected data with the bit sequence "1101 0101" and the raw data with the bit sequence "0010 1111", the processing device determines that the number of unset bit errors is greater than the RBER threshold and the method 300 moves to operation 312.

At operation 312, the processing device rewrites the phase change memory cells with the corrected data generated at operation 306. Rewriting the phase change memory cells corrects for read disturbance errors, which are caused by repeated reads to the phase change memory cells (e.g., thousands, tens of thousands, hundreds of thousands, etc. of read operations). For example, rewriting the phase change memory cells undoes any resistivity changes that may have resulted in consequent phase changes based on repeated reads to the phase change memory cells. However, although there is an attempt to correct all errors in phase change memory cells that are the subject of a rewrite, rewriting the phase change memory cells may not correct for non-read disturbance errors or other errors that are not correctable by rewrite (e.g., structural defects that cause phase change memory cells to be stuck in the amorphous phase (i.e., the binary value "0" or unset) or are otherwise predisposed to incorrectly sense in the amorphous phase due to intrinsic weakness).

At operation 314, the processing device corrects the raw data from operation 304 for any set bit errors to produce set corrected raw data. In the example provided above in which the corrected data has the bit sequence "1101 0101" and the raw data has the bit sequence "0010 1111", the processing device corrects for each of the three set bit errors to produce set corrected raw data with the bit sequence "0000 0101" at operation 314. In situations in which the processing device determines that there are no set bit errors in the raw data, the processing device can determine to not perform operation 314 but otherwise makes the set corrected raw data to be equal to the raw data from operation 304.

At operation 316, the processing device stores/buffers/writes the set corrected raw data in an entry of a buffer, which is outside of the phase change memory cells (e.g., outside the memory components 112A to 112N). For example, the processing device stores/buffers/writes the set corrected raw data in an entry of the DDB 221 (e.g., stored in the user data 219 of the DDB 221). Storage of the set corrected raw data in the DDB 221 and otherwise use of the DDB 221 will be used hereinafter for purposes of explaining the method 300. However, any other storage location, buffer, or structure outside of the phase change memory cells (e.g., outside the memory components 112A to 112N) can be used in place of the DDB 221.

As noted above, the set corrected raw data is produced based on the raw data read from phase change memory cells at operation 304. Accordingly, the set corrected raw data stored in an entry of the DDB 221 possibly includes unset bit errors (e.g., read disturbance errors and/or non-read disturbance errors in which bits in the set corrected raw data are sensed to have a value of "0" instead of the written value of "1"). Adding set corrected raw data in an entry of the DDB 221 may include adding or modifying a DET entry 213 and/or an MUA entry 203 as described above.

At operation 318, the processing device marks the entry in the DDB 221 of operation 316 to indicate the number of unset bit errors in the set corrected raw data stored in the entry. For instance, in the example above, the processing device marks the entry to indicate that the set corrected raw data stored in the entry includes three unset bit errors. The marking at operation 318 can be used for flagging the entry for reread/reassessment after a resistivity drift period. For example, the processing device can mark the entry in the DDB 221 by setting the error count 229 with the number of unset bit errors determined by the processing device at operation 308. As will be described below, upon the resistivity drift period elapsing/expiring and/or the entry in the DDB 221 and/or a DET entry 213 otherwise being evicted or replaced, the processing device can reread and reassess the corresponding phase change memory cells of the memory components 112A to 112N when the error count 229 is greater than zero. As will be explained in greater detail below, this reassessment may include rereading the phase change memory cells and comparing the raw data of the reread to set corrected raw data stored in the entry in the DDB 221 and selectively updating the RBER threshold based on this comparison.

At operation 320, the processing device can fulfill zero or more read requests from a host system 120 for the address of the original read request of operation 302 based on the set corrected raw data stored in the entry of the DDB 221. In particular, in response to a read request from a host system 120, an ECC decoder of the processing device can decode the set corrected raw data stored in the user data 219 of the DDB 221 to produce corrected data (i.e., both set and unset errors are corrected). The corrected data can be returned to the host system 120 via a host interface. Fulfillment of read requests using the DDB 221 can be performed until expiration of the resistivity drift period (e.g., one-hundred milliseconds since the phase change memory cells at the address were rewritten at operation 316). In one embodiment, the determination of whether the data stored in the user data 219 field of an entry in the DDB 221 includes errors or is corrected data may be based on the error count 229. Namely, when the error count 229 is greater than zero, the user data 219 stores raw data (i.e., data with some number of bit errors) that should be corrected before fulfilling a read request from a host system 120. Conversely, when the error count 229 is equal to zero, the user data 219 stores corrected data (i.e., data with some number of bit errors) that does not need to be corrected before fulfilling a read request from a host system 120.

At operation 322, the processing device determines that the entry in the DDB 221 is ready to be removed/evicted from the DDB 221. For example, the processing device can determine that the entry is ready to be removed/evicted from the DDB 221 after the resistivity drift period has elapsed (e.g., after one-hundred milliseconds since the last write/rewrite of the corresponding phase change memory cells).

At operation 324, the processing device determines if the number of unset bit errors indicated by the entry in the DDB 221 is greater than zero. For example, the processing device can determine if the number of unset bit errors indicated by the entry in the DDB 221 is greater than zero by using the error count 229 at operation 324. When the error count 229 is less than zero, no adjustment of an RBER threshold associated with the phase change memory cells is necessary since no unset bit errors were detected in raw data read from these phase change memory cells. Accordingly, following determining that the error count 229 indicated by the entry in the DDB 221 is equal to zero, the method 300 moves to operation 326.

At operation 326, the processing device evicts the entry from the DDB 221. Eviction of the entry from the DDB 221 allows the entry to be used for buffering data of a future write to the phase change memory cells.

Returning to operation 324, when the processing device determines at operation 324 that the number of unset bit errors indicated by the entry in the DDB 221 is greater than zero (i.e., the error count 229 for the entry is greater than zero), the method 300 moves to operation 328 for a reread of the phase change memory cells. Accordingly, the error count 229 for the entry can operate as a reread indication for corresponding data/codewords in the phase change memory cells.

At operation 328, the processing device reads raw data from the phase change memory cells at the indicated address to produce updated raw data. As noted above, this read operation is performed after the resistivity drift period. Since the phase change memory cells were recently rewritten at operation 312, read disturbance errors should not be present in the updated raw data. Instead, any unset bit errors present in the updated raw data read from the phase change memory cells are non-read disturbance errors, which cannot be corrected using a rewrite operation. These non-read disturbance unset bit errors may be based on structural defects that cause phase change memory cells to be stuck in the amorphous phase (i.e., the binary value "0" or unset) or are otherwise predisposed to incorrectly sense in the amorphous phase due to intrinsic weakness. For example, the updated raw data may include the bit sequence "0101 0101". As described above, the corrected data sequence is "1101 0101". Accordingly, as will be discovered by the remaining operations of the method 300 described below, the most significant bit includes a non-read disturbance unset bit error.

At operation 330, the processing device performs directional bit error correction on the updated raw data to correct for set bit errors. This correction produces directionally corrected updated raw data in which the only bit errors that are possibly present are unset bit errors. Using the example updated raw data bit sequence "0101 0101", no directional bit error correction is performed as there are no set bit errors in the updated raw data. Thus, the processing device sets the directionally corrected updated raw data equal to the updated raw data at operation 330.

At operation 332, the processing device compares the directionally corrected updated raw data with the buffered raw data (e.g., the raw data stored in the user data 219 of the DDB 221) to determine the number of zeros in the buffered raw data that are ones in the directionally corrected updated raw data. For example, an exclusive-or (XOR) operation can be performed between the buffered raw data (BRD) and the directionally corrected updated raw data (URD) and a logical and operation (AND) is performed on this result and the updated raw data (URD) to produce a final result bit sequence (e.g., final result bit sequence=((BRD XOR URD) AND URD). The bit values in the final result bit sequence are summed to determine the number of zeros in the buffered raw data that are ones in the directionally corrected updated raw data. This summed error value will be used to determine whether the RBER threshold should be modified/biased. For instance, using the example bit sequence above in which the buffered raw data (BRD) is the bit sequence "0000 0101" (i.e., the set corrected raw data from operation 314) and the directionally corrected updated raw data (URD) is the bit sequence "0101 0101", the final result bit sequence is "0101 0000", which corresponds to a summed error value of two.

At operation 334, the processing device analyzes the summed error value from operation 332 to determine a possible remediation action for the RBER threshold. For example, when the summed error value is equal to the number of unset bit errors represented in the error count 229, all of the unset errors in the raw data are read disturbance errors and no adjustments to the RBER threshold are required. Accordingly, upon determining at operation 334 that the summed error value is equal to the number of bit errors represented in the error count 229, the method 300 moves to operation 326 to evict the entry in the DDB 221 without adjustment to the RBER threshold.

Alternatively, when the summed error value is less than the number of bit errors represented in the error count 229, the difference between these values is the number of phase change memory cells that include non-read disturbance errors or are otherwise stuck at the value "0" without being correctable by a re-write operation. Accordingly, when the number of summed error value is less than the number of bit errors represented in the error count 229, the processing device can bias/modify the RBER threshold for the phase change memory cells based on the this determined number of non-read disturbance errors at operation 336. Namely, the RBER threshold for the phase change memory cells may be increased or decreased based on the determined number of non-read disturbance errors (i.e., modified/biased based on some function of the number of non-read disturbance errors). For example, the RBER threshold for the phase change memory cells at the address referenced in the original read request of operation 302 may be increased by the number of non-read disturbance errors. Increasing the RBER threshold in response to detection of non-read disturbance errors allows remediation techniques to exclude non-read disturbance errors in their analysis. Namely, when rewriting/refreshing the phase change memory cells does not offer a benefit to certain bit errors (e.g., non-read disturbance errors), these bit errors can be excluded or otherwise accounted for in the rewrite/refresh determination. In the above example implementation of the method 300, each phase change memory cell or set of phase change memory cells (e.g., per codeword) may be associated with a separate RBER threshold and/or a bias/modification value based on the number of non-read disturbance errors. These individualized RBER thresholds and/or bias/modification values may be stored in the hierarchical data structures 200 (e.g., in the metadata 203B of corresponding MUA entries 203). Following or concurrently with adjustment of the RBER threshold, the processing device evicts the entry in the DDB 221 at operation 326.

Although described in relation to adjustment of the RBER threshold, in some embodiments, action can be performed, including the adjustment of other threshold values at operation 336. For example, in some embodiments, a count can be kept of non-read disturbance errors amongst a sector of phase change memory cells. At operation 336, the processing device can increment this count based on the newly determined non-read disturbance errors. Once the count reaches a threshold value, a rebuild can be performed (e.g., a Redundant Array of Independent Disks (RAID) rebuild) that takes into account these flawed phase change memory cells.

In the unlikely event that the summed error value is greater than the number of bit errors represented in the error count 229, the test is inconclusive and no RBER threshold adjustments is made. In particular, the method 300 moves to operation 326 to evict the entry in the DDB 221.

In the example bit sequences used above, the summed error value is equal to two and the error count 229 is equal to three. Accordingly, at operation 334 the processing device determines that the summed error value is less than the number of bit errors represented in the error count 229 (i.e., 2<3). The difference between the summed error value and the number of bit errors represented in the error count 229 indicates that there is one non-read disturbance error in the phase change memory cells. The processing device can adjust the RBER threshold for the phase change memory cells based on this single non-read disturbance error.

As described above, the method 300 efficiently remediates read disturbances to phase change memory cells in view of non-read disturbances and resistivity drift issues. In particular, the method 300 allows for the determination of which bit errors are the result of read disturbances and which bit errors are the result of non-read disturbances for biasing an RBER threshold such that rewrite remediation of corresponding phase change memory cells may be efficiently performed. For example, through the performance of the method 300 the memory subsystem 110 may benefit from improved power management, transaction QoS, and phase change memory cell endurance through the elimination/reduction of rewrites that do not improve or reduce RBER. The method 300 also leverages data storage capabilities in a drift management system (e.g., the hierarchical data structures 200 and in particular the DDB 221) to minimize the net metadata tracking overhead and associated hardware logic.

Figure 4:
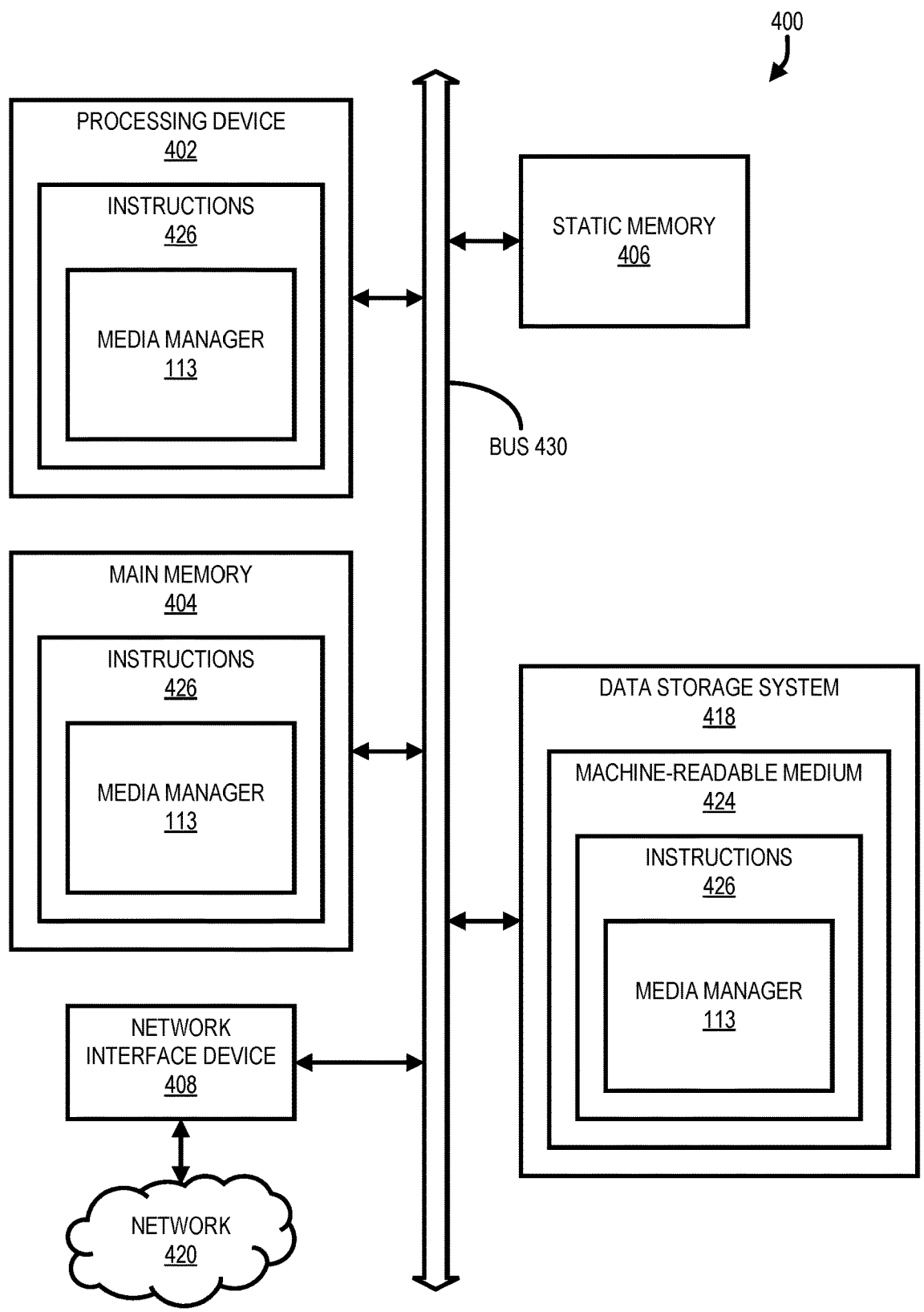
FIG. 4 is a block diagram of an example computer system in which embodiments of the present disclosure can operate.

FIG. 4 illustrates an example machine of a computer system 400 within which a set of instructions, for causing the machine to perform any one or more of the methodologies discussed herein, can be executed. In some embodiments, the computer system 400 can correspond to a host system (e.g., the host system 120 of FIG. 1) that includes, is coupled to, or utilizes a memory subsystem (e.g., the memory subsystem 110 of FIG. 1) or can be used to perform the operations of a controller (e.g., to execute an operating system to perform operations corresponding to the media manager 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 400 includes a processing device 402, a main memory 404 (e.g., read-only memory (ROM), flash memory, dynamic random access memory (DRAM) such as synchronous DRAM (SDRAM) or Rambus DRAM (RDRAM), etc.), a static memory 406 (e.g., flash memory, static random access memory (SRAM), etc.), and a data storage system 418, which communicate with each other via a bus 430.

Processing device 402 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 402 can also be one or more special-purpose processing devices such as an application specific integrated circuit (ASIC), a field programmable gate array (FPGA), a digital signal processor (DSP), network processor, or the like. The processing device 402 is configured to execute instructions 426 for performing the operations and steps discussed herein. The computer system 400 can further include a network interface device 408 to communicate over the network 420.

The data storage system 418 can include a machine-readable storage medium 424 (also known as a computer-readable medium) on which is stored one or more sets of instructions 426 or software embodying any one or more of the methodologies or functions described herein. The instructions 426 can also reside, completely or at least partially, within the main memory 404 and/or within the processing device 402 during execution thereof by the computer system 400, the main memory 404 and the processing device 402 also constituting machine-readable storage media. The machine-readable storage medium 424, data storage system 418, and/or main memory 404 can correspond to the memory subsystem 110 of FIG. 1.

In one embodiment, the instructions 426 include instructions to implement functionality corresponding to a media manager (e.g., the media manager 113 of FIG. 1). While the machine-readable storage medium 424 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. For example, a computer system or other data processing system, such as the controller 115, may carry out the computer-implemented method 300 in response to its processor executing a computer program (e.g., a sequence of instructions) contained in a memory or other non-transitory machine-readable storage medium. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
   reading first raw data from a set of memory cells at an indicated address;
   determining a number of errors in the first raw data;
   flagging the set of memory cells for rereading in response to determining that the number of errors is greater than a threshold;
   reading second raw data from the set of memory cells in response to flagging the set of memory cells for rereading;
   performing a comparison based on the first raw data and the second raw data to determine a number of non-read disturbance errors; and
   modifying, in response to the comparison, the threshold based on the number of non-read disturbance errors.

2. The method of claim 1, wherein the errors are unset errors, and
   wherein unset errors are bit errors that are erroneously represented as a binary value of zero in the first raw data.

3. The method of claim 2, further comprising:
   correcting the first raw data to produce corrected first raw data in response to determining that the number of unset errors is greater than the threshold;
   writing the first raw data to the set of memory cells; and
   writing to a set of data structures outside of the set of memory cells based on the first raw data.

4. The method of claim 3, wherein the set of data structures includes a drift buffer entry that is written based on the first raw data,
   wherein read requests for the address are fulfilled using the entry in the drift buffer during a resistivity drift period, and
   wherein the resistivity drift period is a period of time following the write of the corrected data to the set of memory cells.

5. The method of claim 4, wherein the entry in the set of data structures includes an error count associated with the set of memory cells, and
   wherein flagging the set of memory cells for rereading includes setting the error count to the number of unset errors in the first raw data.

6. The method of claim 5, further comprising:
   determining that the error count of the entry is greater than zero, wherein reading the second raw data is performed in response to determining that the error count of the entry is greater than zero; and
   wherein the comparison includes performing a set of bitwise logical operations based on the first raw data and the second raw data to determine the number of unset bits in the first raw data, which is stored in the set of data structures, that are set in the second raw data.

7. The method of claim 6, wherein the modifying of the threshold is performed when the number of unset bits in the first raw data that are set in the second raw data is less than the error count.

8. A system comprising:
a media manager to read first raw data from a set of memory cells at an indicated address and determine a number of unset errors in the first raw data, wherein unset errors are bit errors that are erroneously represented as a binary value of zero in the first raw data; and
a set of data structures, wherein the set of data structures stores data based on the first raw data and an error count to indicate whether to reread the set of memory cells.

9. The system of claim 8, wherein the media manager is to set the error count in response to determining that the number of unset errors is greater than a threshold.

10. The system of claim 9, wherein the media manager is to read second raw data from the set of memory cells in response to setting the error count and the media manager to compare the first raw data with the second raw data to determine a number of non-read disturbance errors.

11. The system of claim 10, wherein the media manager is to modify the threshold based on the number of non-read disturbance errors.

12. The system of claim 10, wherein the media manager is to:
correct the first raw data to produce corrected data in response to determining that the number of unset errors is greater than the threshold;
write the corrected data to the set of memory cells; and
write based on the first raw data to the set of data structures.

13. The system of claim 12, wherein the set of data structures includes a drift buffer and the media manager writes based on the first raw data to an entry in the drift buffer.

14. The system of claim 13, wherein the media manager fulfills read requests for the address using the entry in the drift buffer during a resistivity drift period, and
wherein the resistivity drift period is a period of time following the write of the corrected data to the set of memory cells.

15. A system comprising:
a memory component; and
a processing device, coupled to the memory component, configured to:
read first raw data from a set of memory cells at an indicated address;
determine a number of errors in the first raw data;
flag the set of memory cells for rereading in response to determining that the number of errors is greater than a threshold;
read second raw data from the set of memory cells in response to flagging the set of memory cells for rereading;
perform a comparison based on the first raw data and the second raw data to determine a number of non-read disturbance errors; and
modify, in response to the comparison, the threshold based on the number of non-read disturbance errors.

16. The system of claim 15, wherein the errors are unset errors, and
wherein unset errors are bit errors that are erroneously represented as a binary value of zero in the first raw data.

17. The system of claim 16, wherein the processing device is further configured to:
correct the first raw data to produce corrected first raw data in response to determining that the number of unset errors is greater than the threshold;
write the first raw data to the set of memory cells; and
write to a set of data structures outside of the set of memory cells based on the first raw data.

18. The system of claim 17, wherein the set of data structures includes a drift buffer entry that is written based on the first raw data,
wherein read requests for the address are fulfilled using the entry in the drift buffer during a resistivity drift period, and
wherein the resistivity drift period is a period of time following the write of the corrected data to the set of memory cells.

19. The system of claim 18, wherein the set of data structures includes a read indication associated with the set of memory cells,
wherein flagging the set of memory cells for rereading includes setting the read indication, and
wherein when the read indication is set, the set of data structures includes raw data that is to be corrected prior to fulfilling a read request for a host system, and when the read indication is unset, the set of data structures includes corrected data for fulfilling the read request to the host system.

20. The system of claim 19, wherein the entry in the set of data structures includes an error count associated with the set of memory cells, and
wherein flagging the set of memory cells for rereading includes setting the error count to the number of unset errors in the first raw data.

* * * * *